United States Patent
Konishi

[11] Patent Number: 6,081,457
[45] Date of Patent: Jun. 27, 2000

[54] OVER-ERASURE PREVENTING DEVICE AND METHOD

[75] Inventor: Masayuki Konishi, Tokyo, Japan

[73] Assignee: Mitsubishi Denki Kabushiki Kaisha, Tokyo, Japan

[21] Appl. No.: 09/226,165

[22] Filed: Jan. 7, 1999

[30] Foreign Application Priority Data

Jul. 21, 1998 [JP] Japan .................... 10-205599

[51] Int. Cl.$^7$ .................................... G11C 16/04
[52] U.S. Cl. ................... 365/185.3; 365/185.29; 365/185.26
[58] Field of Search ............ 365/185.3, 185.29, 365/185.26, 185.33

[56] References Cited

U.S. PATENT DOCUMENTS

| | | | |
|---|---|---|---|
| 5,475,249 | 12/1995 | Watsuji et al. | 257/316 |
| 5,646,885 | 7/1997 | Matsuo et al. | 365/185.05 |
| 5,657,271 | 8/1997 | Mori | 365/185.27 |
| 5,742,541 | 4/1998 | Tanigami et al. | 365/185.3 |
| 5,787,037 | 7/1998 | Amanai | 365/185.18 |

FOREIGN PATENT DOCUMENTS

| | | |
|---|---|---|
| 7-21789 | 1/1995 | Japan . |
| 9-35487 | 2/1997 | Japan . |

*Primary Examiner*—David Nelms
*Assistant Examiner*—Hien Nguyen
*Attorney, Agent, or Firm*—Burns, Doane, Swecker & Mathis, LLP

[57] ABSTRACT

An over-erasure preventing device which applies, when erasing data written in a memory cell, an erasing voltage to an N-type source, and a potential difference reducing voltage to a control gate, so that the potential difference between the N-type source and control gate is reduced. This makes it possible to solve a problem involved in a conventional device in that once the memory cell has been destroyed by an over-erasure, the data read and write become impossible although the over-erasure can be remedied.

12 Claims, 6 Drawing Sheets

OVER-ERASURE PREVENTING DEVICE AND METHOD

BACKGROUND OF THE INVENTION

1. Field of the Invention

The present invention relates to an over-erasure preventing device and method for controlling over-erasure of data stored in memory cells of a flash memory.

2. Description of Related Art

FIG. 8 is a cross-sectional view of a memory cell of a flash memory to which a conventional over-erasure preventing device is applied which is disclosed in Japanese patent application laid-open No. 9-35487/1997. In FIG. 8, the reference numeral 1 designates a control gate that is grounded when erasing data written in the memory cell; 2 designates a floating gate that contains electrons in a data written state; 3 designates an N-type source to which an erasing voltage of 12 V is applied for pulling out the electrons from the floating gate 2 when erasing data written in the memory cell; 4 designates an N-type drain that is placed at an open state when erasing the data written in the memory cell; and 5 designates a P-substrate.

Next, the operation of the conventional memory cell will be described.

First, the memory cell holds electrons in its floating gate 2 in the data written state, and the data can be erased by drawing out the electrons from the floating gate 2 to the N-type source 3.

The draw of the electrons from the floating gate 2 to the N-type source 3 for erasing data can be achieved by grounding the control gate 1 and applying the erasing voltage of 12 V to the N-type source 3 to cause the tunnel effect. However, repetitive application of the erasing voltage of the 12 V to the N-type source 3 for a long time will bring about a phenomenon that the floating gate 2 is positively charged, which will be referred to as "over-erasure" from now on.

Once the over-erasure takes place, the threshold voltage of the memory cell becomes negative, thereby hindering correct read or write of data.

To deal with the over-erasure, the conventional device carries out, after completing the drawing of the electrons from the floating gate 2, weak write by grounding the N-type source 3 and applying the voltage of 12 V to the control gate 1, thereby keeping the threshold voltage of the memory cell positive. Thus, the over-erasure can be remedied.

With the foregoing arrangement, the conventional over-erasure preventing device can remove the over-erasure state. However, once the memory cell has been broken owing to the over-erasure, this will present a problem of making data read and write impossible, even if the over-erasure state is remedied afterward.

In addition, since the weak write must be carried out after drawing out the electrons from the floating gate 2, a problem arises in that the erasing processing becomes complicated and time consuming.

Another technique is disclosed in Japanese patent application laid-open No. 7-272491/1995, in which the weak write is carried out while a leakage current due to the over-erasure is flowing. In this case also, as in the foregoing conventional example, once the memory cell has been broken owing to the over-erasure, a problem arises of making data read and write impossible, even if the over-erasure state is compensated.

SUMMARY OF THE INVENTION

The present invention is implemented to solve the foregoing problem. It is therefore an object of the present invention to provide an over-erasure preventing device and method capable of preventing the over-erasure from taking place.

According to a first aspect of the present invention, there is provided an over-erasure preventing device comprising: voltage applying means for impressing an erasing voltage to a source of a memory cell when erasing data written in the memory cell; and potential difference reducing means for reducing a potential difference between the source and a control gate of the memory cell by supplying the control gate with a potential difference reducing voltage, when the voltage applying means impresses the erasing voltage to the source.

Here, the potential difference reducing means may supply, when data erasure of the memory cell has been completed, the erasing voltage to the control gate of the memory cell.

The potential difference reducing means may further comprise a decision device for deciding a written state of the memory cell, and a switch for supplying the control gate with one of the potential difference reducing voltage and the erasing voltage in response to a decision result of the decision device.

A source line common to a plurality of memory cells may be divided.

The potential difference reducing voltage may be lower than the erasing voltage.

The plurality of memory cells may be embedded in a same memory chip.

According to a second aspect of the present invention, there is provided an over-erasure preventing method comprising: a first step of impressing an erasing voltage to a source of a memory cell when erasing data written in the memory cell; and a second step of reducing a potential difference between the source and a control gate of the memory cell by supplying the control gate with a potential difference reducing voltage, when the voltage applying means impresses the erasing voltage to the source.

Here, the second step may comprise a step of supplying, when data erasure of the memory cell has been completed, the erasing voltage to the control gate of the memory cell.

The second step may comprise a step of deciding a written state of the memory cell, and a step of supplying the control gate with one of the potential difference reducing voltage and the erasing voltage in response to a decision result of the step of deciding.

A source line common to a plurality of memory cells may be divided.

The potential difference reducing voltage may be lower than the erasing voltage.

The plurality of memory cells may be embedded in a same memory chip.

DETAILED DESCRIPTION OF THE PREFERRED EMBODIMENTS

The invention will now be described with reference to the accompanying drawings.

EMBODIMENT 1

Figure 1:
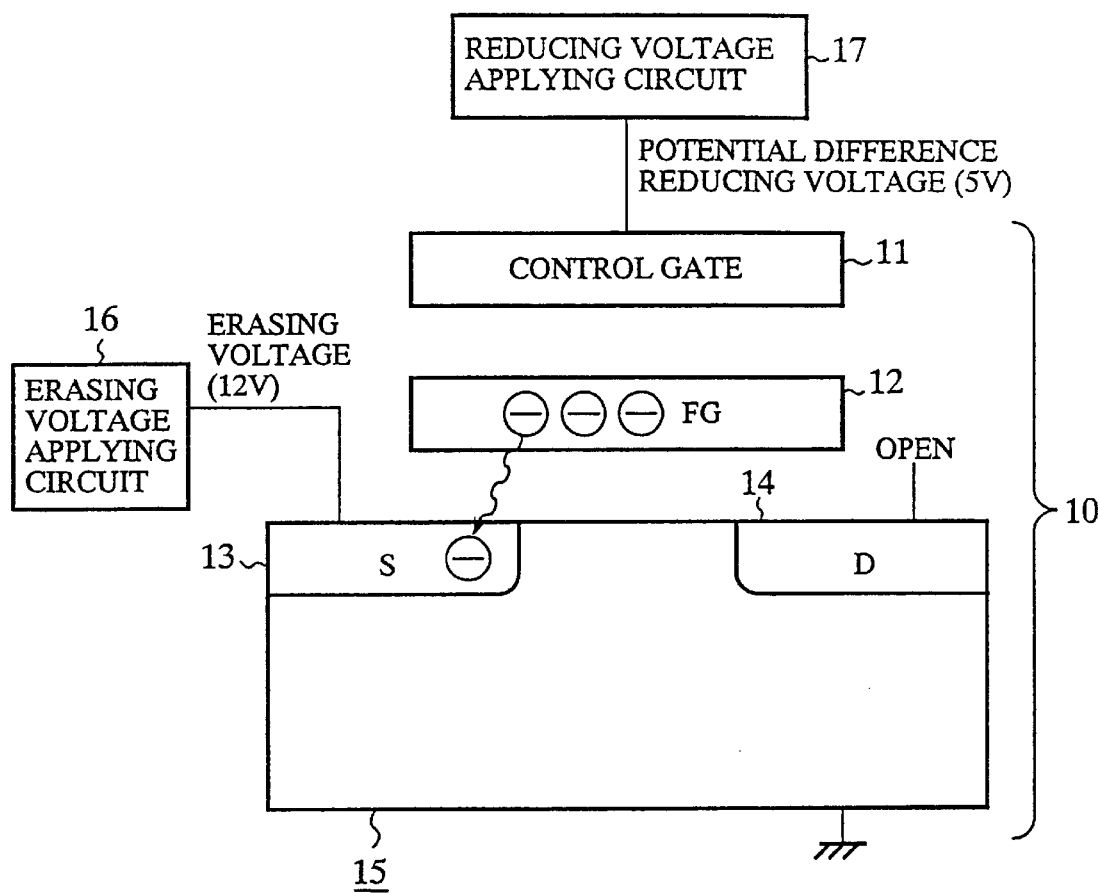
FIG. 1 is a block diagram showing a configuration of an embodiment 1 of an over-erasure preventing device in accordance with the present invention.

FIG. 1 is a block diagram showing a configuration of an embodiment 1 of an over-erasure preventing device in accordance with the present invention. In FIG. 1, the reference numeral 10 designates a memory cell; 11 designates a control gate of a memory cell 10; 12 designates a floating gate in which electrons are held in a data written state; 13 designates an N-type source (source) to which an erasing voltage of 12 V is applied for drawing out the electrons from the floating gate 12, when erasing data written in the memory cell 10; 14 designates an N-type drain which is placed at an open state when erasing data written in the memory cell 10; and 15 designates a P-substrate.

The reference numeral 16 designates an erasing voltage applying circuit (voltage applying means) for applying an erasing voltage to the N-type source 13, when erasing data stored in the memory cell 10; and 17 designates a reducing voltage applying circuit (potential difference reducing means) for reducing the potential difference between the N-type source 13 and the control gate 11 by applying the potential difference reducing voltage to the control gate 11 in response to the impression of the erasing voltage to the source 13 by the erasing voltage applying circuit 16.

Figure 3:
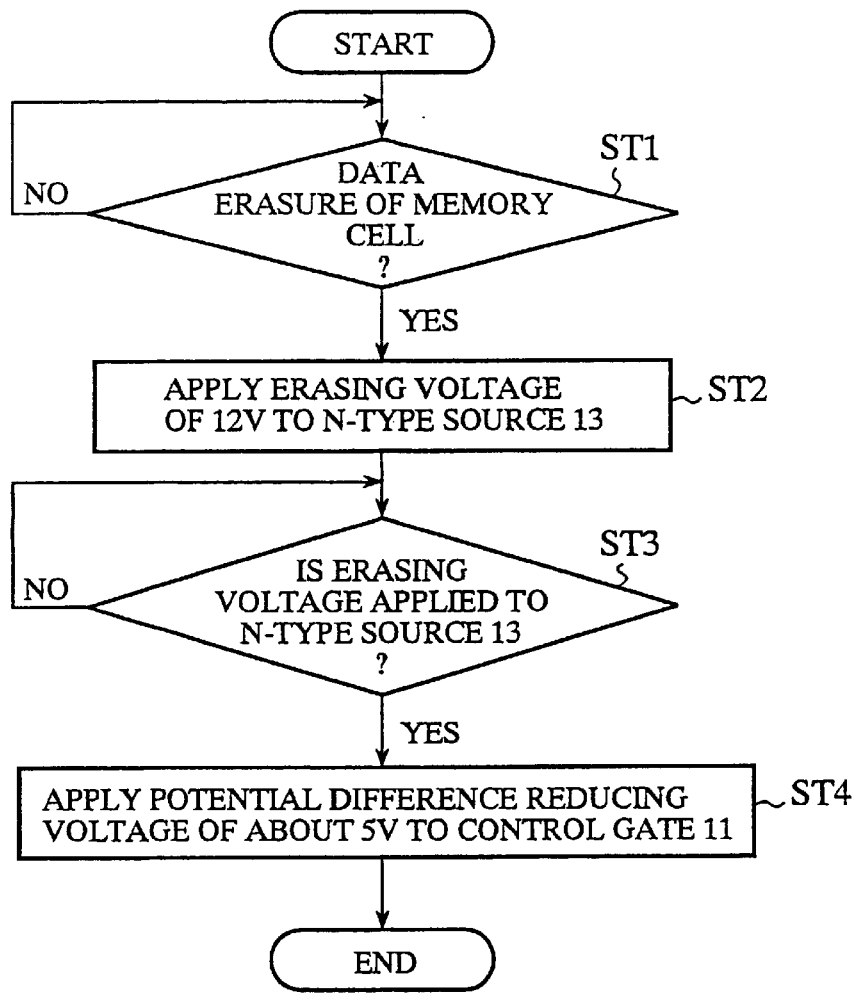
FIG. 3 is a flowchart illustrating an over-erasure preventing method of the embodiment 1.

Next, the operation of the present embodiment 1 will be described with reference to the flowchart of FIG. 3 of an over-erasure preventing method of the present embodiment 1.

First, erasure of the data in the memory cell 10 can be achieved by drawing out the electrons, which are retained in the floating gate 12 in a data written state of the memory cell 10, from the floating gate 12 to the N-type source 13.

As described before, the draw of the electrons from the floating gate 12 to the N-type source 13 for erasing data can be achieved by grounding the control gate 11 and applying the erasing voltage of 12 V to the N-type source 13 to cause the tunnel effect. However, repetitive application of the erasing voltage of the 12 V to the N-type source 13 for a long time will bring about the over-erasure.

In view of this, in the present embodiment 1, when the erasing voltage of 12 V is impressed to the N-type source 13 by the erasing voltage applying circuit 16 for erasing data written in the memory cell (at steps ST1 and ST2), the potential difference between the N-type source 13 and control gate 11 is reduced by applying to the control gate 11 the potential difference reducing voltage of about 5 V by the reducing voltage applying circuit 17 (at steps ST3 and ST4), thereby preventing the over-erasure from taking place.

Figure 2:
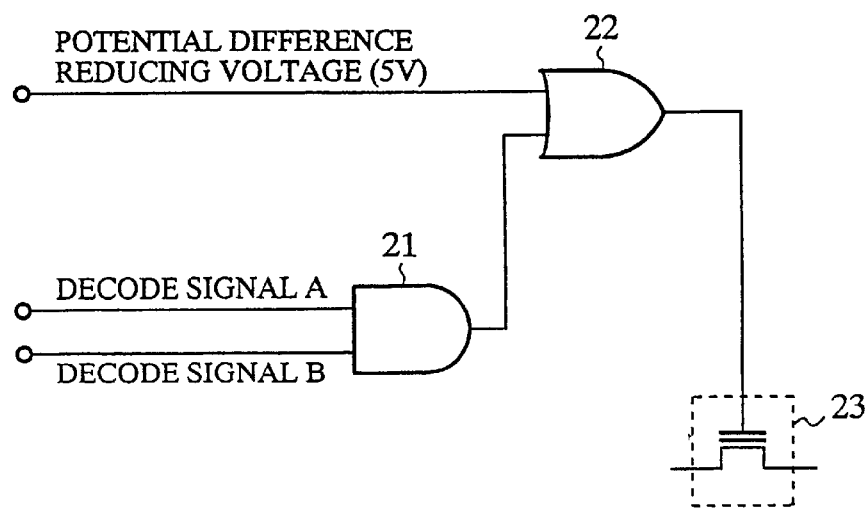
FIG. 2 is a circuit diagram illustrating a circuit for applying a potential difference reduction voltage.

For example, as shown in FIG. 2, when a logic gate 21 decodes a memory cell 23 in response to decode signals A and B, a logic gate 22 applies, during data erasure, the potential difference reducing voltage of about 5 V to the control gate 11 of the memory cell 23 to reduce the potential difference between the N-type source 13 and control gate 11. This will weaken the draw of the electrons by the N-type source 13.

As described above, the present embodiment 1 is configured such that the potential difference between the N-type source 13 and control gate 11 is reduced by applying the potential difference reducing voltage to the control gate 11 during the impression of the erasing voltage to the N-type source 13 for erasing data written in the memory cell. This weakens the force of the N-type source 13 for drawing out the electrons, which offers an advantage of being able to prevent the over-erasure from taking place.

EMBODIMENT 2

Although the foregoing embodiment 1 reduces, when erasing data written in the memory cell 10, the potential difference between the N-type source 13 and control gate 11 by applying the potential difference reducing voltage to the control gate 11, this is not essential. For example, a decision about the data erasure can be made, and an erasing voltage can be applied to the control gate 11 after the data erasure has been completed.

Figure 4:
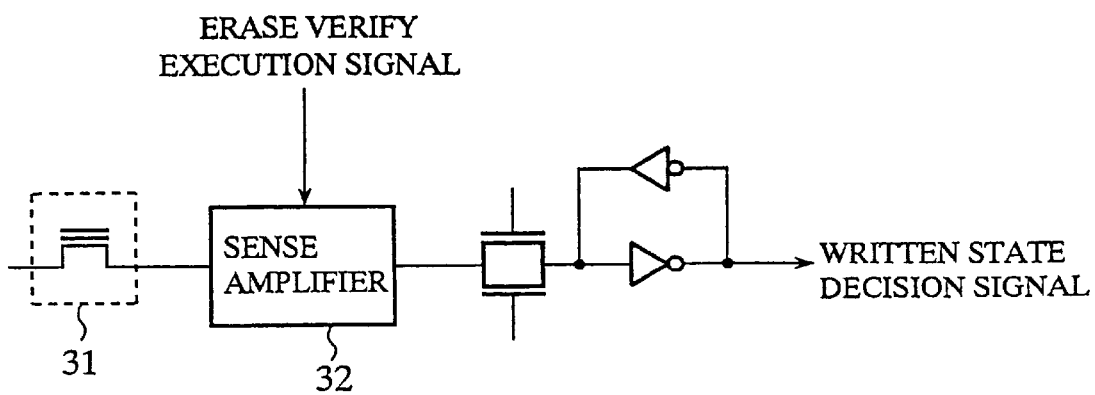
FIG. 4 is a circuit diagram showing a decision circuit of a write state of the memory cell.

FIG. 4 shows such an example, in which a sense amplifier 32 (decision device), receiving an erase verify execution signal, makes a decision about a written state of a memory cell 31.

Figure 5:
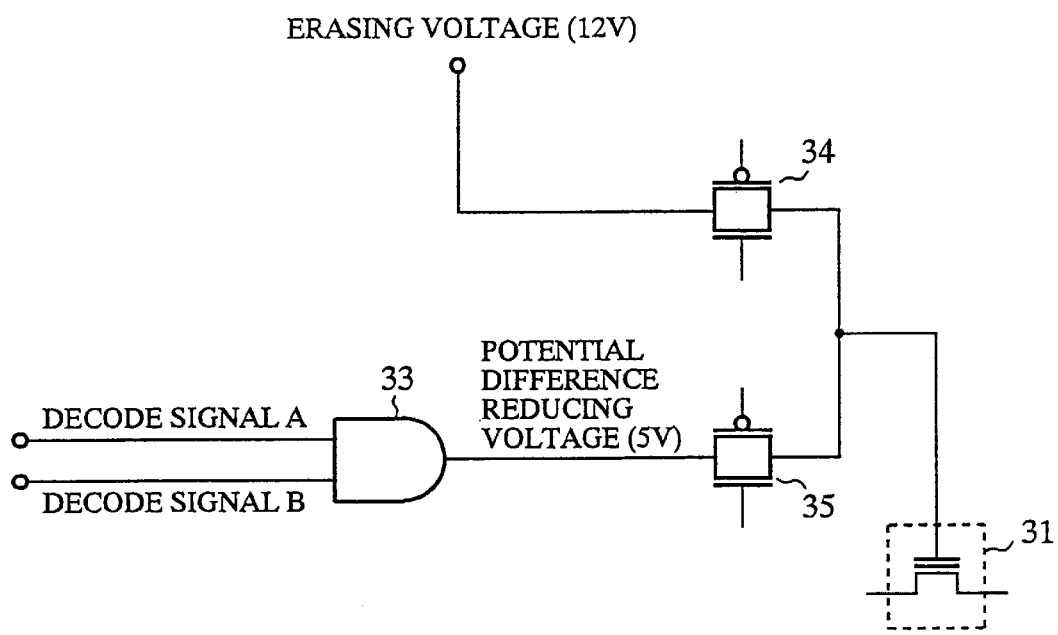
FIG. 5 is a circuit diagram illustrating a circuit for applying to the memory cell one of a potential difference reduction voltage and an erasing voltage.

If the sense amplifier 32 decides that the data is already erased, it supplies switches 34 and 35 of FIG. 5 with a written state decision signal ("H" level signal) indicative of the completion of the data erasure. In contrast, if the data is not yet erased, it supplies the written state decision signal ("L" level signal) indicative of that state to the switches 34 and 35.

The switches 34 and 35, which are always placed in the opposite state to each other, supply the control gate 11 of the memory cell 31 with the erasing voltage of 12 V (a voltage equal to the potential of the erasing voltage impressed to the N-type source 13) when the "H" level written state decision signal indicative of the completion of the data erasure is output, whereas supply the control gate 11 with the potential difference reducing voltage of about 5 V produced by a logic gate 33 for decoding the memory cell 31 when the "L" level written state decision signal indicative of the continuation of the data erasure is output.

Thus, when the data erasure is not yet completed, the control gate 11 of the memory cell 31 is continuously supplied with the potential difference reducing voltage, whereas when the data erasure is completed, the control gate 11 is supplied with the erasing voltage. This eliminates the potential difference between the N-type source 13 and control gate 11, and hence further weakens the force of the N-type source 13 for drawing out the electrons.

As described above, the present embodiment 2 is configured such that the erasing voltage is applied to the control gate 11 when the data erasure is completed. This ensures the draw of the electrons by the N-type source 13 to be carried out during the data erasure of the memory cell, offering an advantage of being able to positively prevent the over-erasure from taking place.

EMBODIMENT 3

Although the erasing voltage applied to the N-type source 13 is 12 V and the potential difference reducing voltage applied to the control gate 11 is about 5 V in the foregoing embodiments 1 and 2, this is not essential.

In addition, although the voltage applied to the control gate 11 after completing the erasure is 12 V in the foregoing embodiment 2, any voltage with a potential higher than the potential difference reducing voltage can be used instead. For example it may be about 10 V.

EMBODIMENT 4

Figure 6:
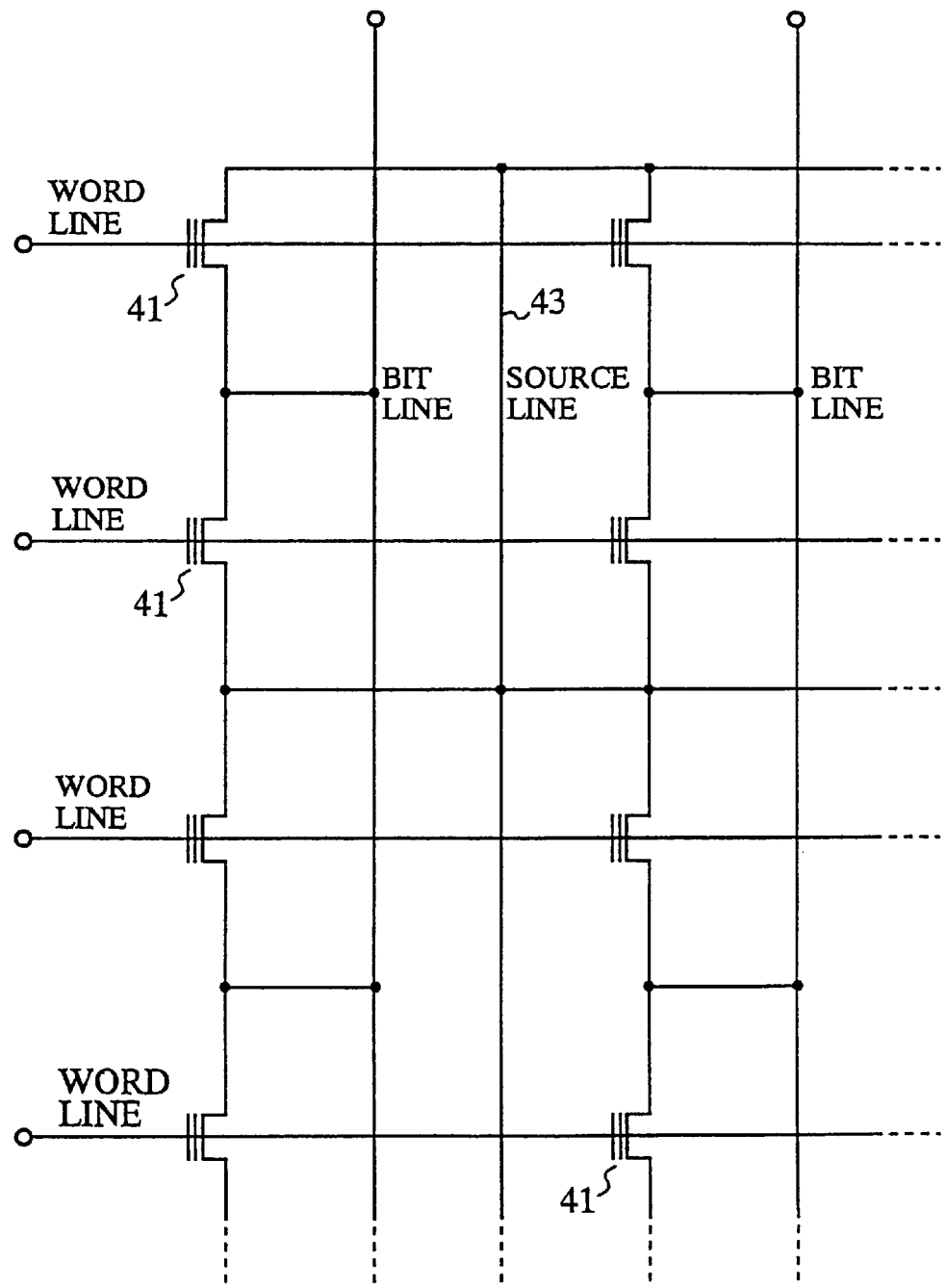
FIG. 6 is a circuit diagram showing a configuration of a flash memory.

Although the foregoing embodiments 1–3 do not refer to the circuit configuration of the flash memory, a source line 43 of an NOR type flash memory is generally common to all the memory cells 41 as shown in FIG. 6. Thus, the data stored in the entire memory cells 41 can be erased at a time.

However, because of variations of erased timings of the data written in the memory cells 41, a state takes place in which data in some memory cells are erased, but data in other memory cells are not yet erased.

In this case, the data erasing processing must be repeated because the data erasure in all the memory cells is not completed. This will increase the possibility of bringing about the over-erasure of the memory cells whose data erasure has already been completed because the erasing processing is continued with those memory cells.

Figure 7:
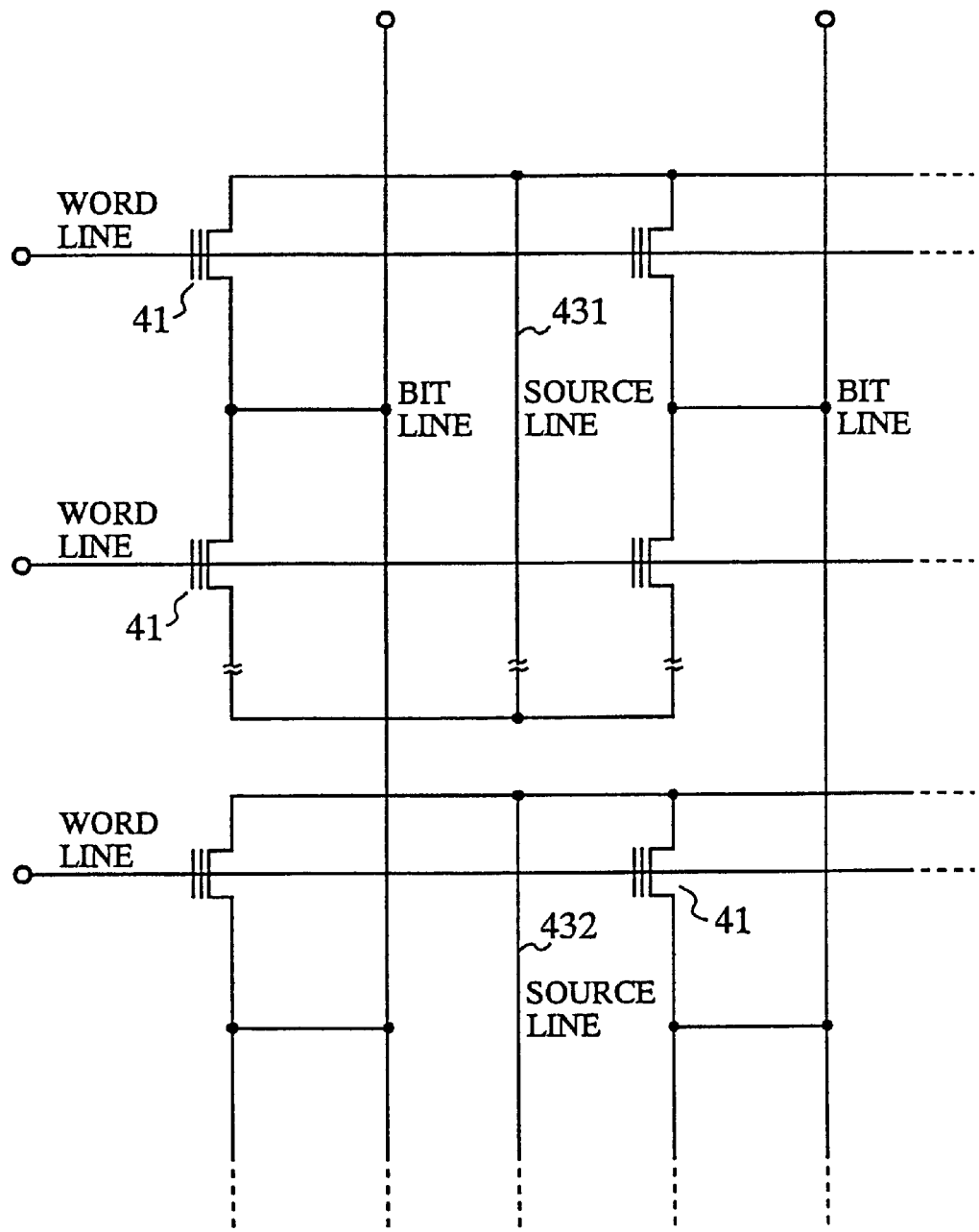
FIG. 7 is a circuit diagram showing a configuration of a flash memory associated with an embodiment 4 in accordance with the present invention.
Figure 8:
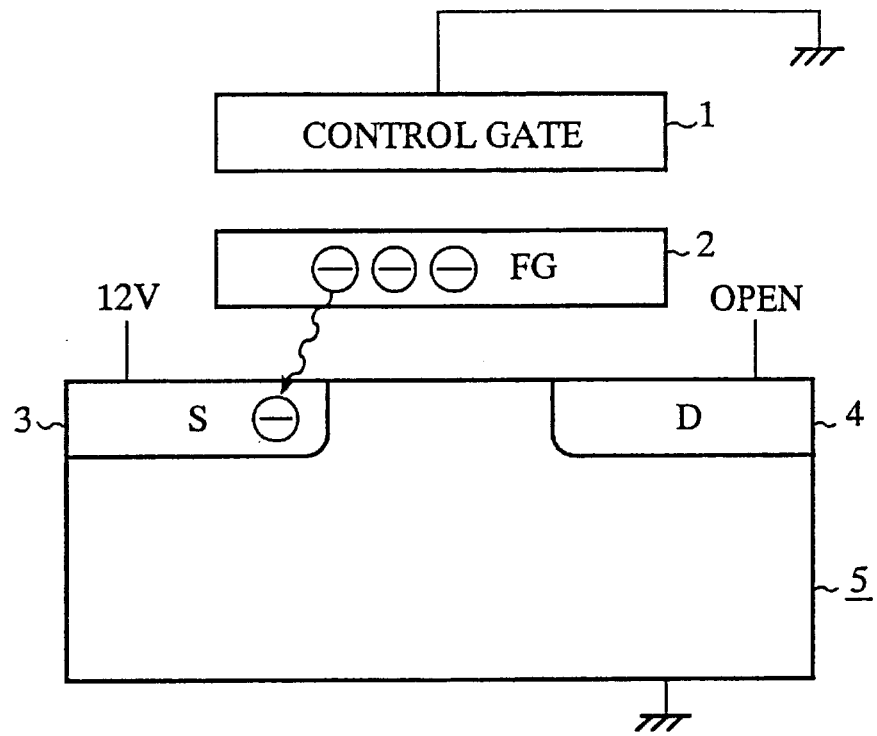
FIG. 8 is a cross-sectional view showing a memory cell of a flash memory to which a conventional over-erasure preventing device is applied.
Figure 9:
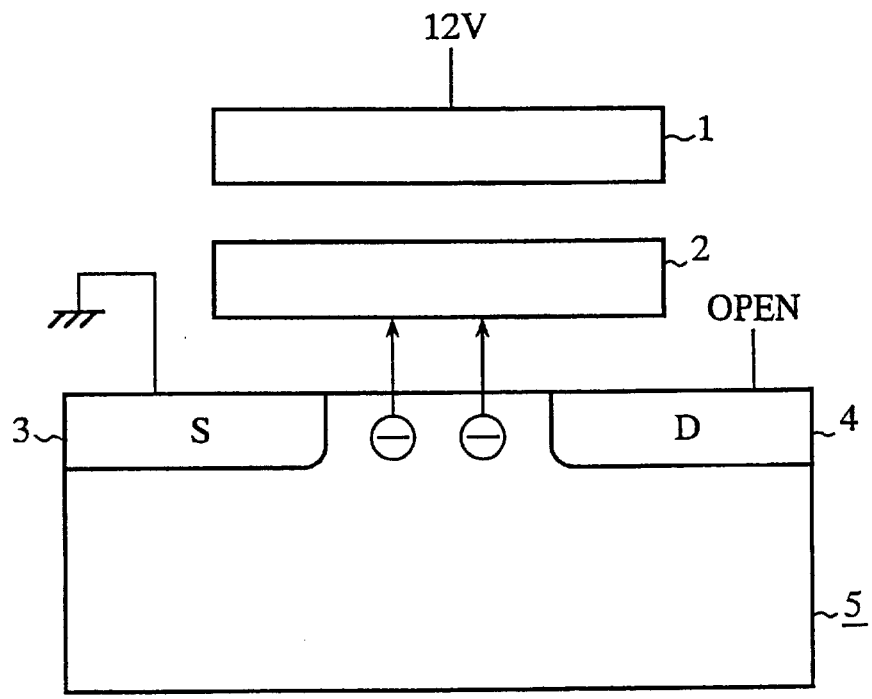
FIG. 9 is a cross-sectional view showing a memory cell of a flash memory to which a conventional over-erasure preventing device is applied.

In view of this, the present embodiment 4 divides the source line 43 into source conductors 431, 432, . . . as shown in FIG. 7 so as reduce a range of erasure at a time, thereby reducing the possibility of bringing about the state in which data in some memory cells are erased, but data in other memory cells are not yet erased.

This makes it possible to reduce the possibility of bringing about the over-erasure.

What is claimed is:

1. An over-erasure preventing device comprising:

voltage applying means for applying an erasing voltage to a source of a memory cell when erasing data written in the memory cell; and potential difference reducing means for reducing a potential difference between the source and a control gate of the memory cell by supplying the control gate with a potential difference reducing voltage, when said voltage applying means applies the erasing voltage to the source.

2. The over-erasure preventing device as claimed in claim 1, wherein said potential difference reducing means supplies, when data erasure of the memory cell has been completed, the erasing voltage to the control gate of the memory cell.

3. The over-erasure preventing device as claimed in claim 2, wherein said potential difference reducing means further comprises a decision device for deciding a written state of the memory cell, and a switch for supplying the control gate with one of the potential difference reducing voltage and the erasing voltage in response to a decision result of the decision device.

4. The over-erasure preventing device as claimed in claim 1, wherein a source line common to a plurality of memory cells is provided by multiple conductors.

5. The over-erasure preventing device as claimed in claim 2, wherein said potential difference reducing voltage is lower than the erasing voltage.

6. The over-erasure preventing device as claimed in claim 4, wherein said plurality of memory cells are embedded in a same memory chip.

7. An over-erasure preventing method comprising:

a first step of applying an erasing voltage to a source of a memory cell when erasing data written in the memory cell; and a second step of reducing a potential difference between the source and a control gate of the memory cell by supplying the control gate with a potential difference reducing voltage, when the erasing voltage is applied to the source.

8. The over-erasure preventing method as claimed in claim 7, wherein said second step comprises a step of supplying, when data erasure of the memory cell has been completed, the erasing voltage to the control gate of the memory cell.

9. The over-erasure preventing method as claimed in claim 8, wherein said second step comprises a step of deciding a written state of the memory cell, and a step of supplying the control gate with one of the potential difference reducing voltage and the erasing voltage in response to a decision result of the step of deciding.

10. The over-erasure preventing method as claimed in claim 7, wherein the sources of a plurality of memory cells are provided by multiple conductors.

11. The over-erasure preventing method as claimed in claim 8, wherein said potential difference reducing voltage is lower than the erasing voltage.

12. The over-erasure preventing method as claimed in claim 10, wherein said plurality of memory cells are embedded in a same memory chip.

* * * * *